(12) United States Patent
Park

(10) Patent No.: US 6,962,873 B1
(45) Date of Patent: Nov. 8, 2005

(54) NITRIDATION OF ELECTROLESSLY DEPOSITED COBALT

(75) Inventor: Heung L. Park, Wilsonville, OR (US)

(73) Assignee: Novellus Systems, Inc., San Jose, CA (US)

( * ) Notice: Subject to any disclaimer, the term of this patent is extended or adjusted under 35 U.S.C. 154(b) by 43 days.

(21) Appl. No.: 10/317,373

(22) Filed: Dec. 10, 2002

(51) Int. Cl.$^7$ .......................................... H01L 21/4763
(52) U.S. Cl. ................... 438/627; 438/643; 438/653; 438/678
(58) Field of Search .................. 438/678, 687, 438/618, 628, 641, 643, 653, 468, 627

(56) References Cited

U.S. PATENT DOCUMENTS

| | | | |
|---|---|---|---|
| 5,380,560 A | | 1/1995 | Kaja et al. |
| 5,695,810 A | | 12/1997 | Dubin et al. |
| 5,824,599 A | | 10/1998 | Schacham-Diamand et al. |
| 6,197,364 B1 | | 3/2001 | Paunovic et al. |
| 2002/0084529 A1 | * | 7/2002 | Dubin et al. ................. 257/774 |
| 2003/0176049 A1 | * | 9/2003 | Hegde et al. ................ 438/591 |

FOREIGN PATENT DOCUMENTS

| | | | | |
|---|---|---|---|---|
| JP | 03-122266 A | * | 5/1991 | |
| JP | 03122266 A | * | 5/1991 | ........... C23C 14/06 |

OTHER PUBLICATIONS

Wolf, Silicon Processing for the VLSI Era, Lattice Press, vol. 3, p. 648.*

O'Sullivan, et al., "Electrolessly Deposited Diffusion Barriers for Microelectronics," The IBM Journal of Research and Development, vol. 42, No. 5, 1998, 13 pages.

Theoretical Studies on the Electroless Metal Deposition Reaction Mechanism Group, printed from website http://www.appchem.waseda.ac.jp on Jul. 3, 2002. Published prior to the filing of this application. 3 Pages.

* cited by examiner

Primary Examiner—George Fourson
Assistant Examiner—Thanh V. Pham
(74) Attorney, Agent, or Firm—Beyer Weaver & Thomas, LLP

(57) ABSTRACT

A method describing a low temperature process of forming a cobalt nitride layer using electroless deposition, followed by a nitridation step, is disclosed. The process described is useful in integrated circuit device fabrication applications, especially those involving the use of copper. The invention can be used to create a highly effective capping layer in high interconnect copper devices.

10 Claims, 3 Drawing Sheets

NITRIDATION OF ELECTROLESSLY DEPOSITED COBALT

BACKGROUND

This invention pertains to a method for obtaining an effective capping layer when applied in the fabrication of integrated circuits. More particularly, the invention focuses on the creation of a cobalt diffusion barrier by electroless deposition, followed by nitridation of the surface of this diffusion barrier, to create a more effective diffusion barrier.

The use of copper as the main on-chip conductor in integrated circuits is now mainstream. Compared to aluminum, copper has lower electrical resistivity and better electromigration and stress-void resistance. However, the substitution of copper in place of aluminum has created various technical challenges.

Among these challenges is copper's high diffusivity in silicon dioxide and other dielectric insulating material used in integrated circuits. Copper diffusion into the surrounding insulator can cause line-to-line shorts. Furthermore, if copper manages to diffuse through the silicon oxide layer and enter into the silicon lattice, it will create impurities that will degrade transistor performance and cause junction leakage.

Another challenge to using copper is that, unlike aluminum, copper does not adhere well to dielectric materials. This adhesion problem can cause voids in the copper lines in areas of the copper-insulator interface. As electrical current is passed through the copper, copper will tend to migrate away from these areas, creating even larger voids and degradation of copper lines. This is the phenomenon of electromigration.

FIG. 1A further illustrates the two issues mentioned above with an illustrated cross section of a portion of a simple dual damascene device. A copper plug 105 connects two copper lines 101 and 103 in separate layers. There is dielectric material 109 that separates the copper lines in regions that the copper plugs do not exist. Conventionally, diffusion barriers (119, 121 and 123) separate the copper lines and plugs from surrounding dielectric material in the same metalization layer (125, 109 and 127, respectively). These diffusion barriers are typically titanium nitride or tantalum nitride. Over time, copper ions from the copper line 103 will diffuse through the dielectric material 109 in this device. In addition, the electromigration of copper and void creation will tend to occur in the copper-dielectric interface regions, especially in corner regions 113.

FIG. 1B depicts a similar device as FIG. 1A, but with a capping layer 115 comprising a diffusion barrier material. Generically, a diffusion barrier is a thin layer of material that is deposited between the conductive and insulating layers in a wafer to prevent metal diffusion into non-conductive areas. Diffusion barriers typically take the form of diffusion barrier layers that line the trenches and vias provided in a dielectric layer during damascene processing. They are also commonly used in "capping" layers that cover the "top" surfaces of deposited copper lines. Ideally, the capping layer can help to alleviate the problem of electromigration. As shown in FIG. 1B, capping layer processes require a capping layer 115 be deposited selectively over the metal surfaces. A capping layer is formed on top of the copper line 103 before the deposition of the dielectric material 109 and copper plug 105. So, compared to the device shown in FIG. 1A, the copper in the device of FIG. 1B is prevented from diffusing into surrounding dielectric and the copper-dielectric interface regions are less susceptible to void formation due to copper electromigration.

Diffusion barrier materials should exhibit low resistivity, nominally less than 1000 $\mu\Omega$-cm. This is so that the resistivity of the composite copper/barrier interconnect area is low and the total line resistivity remains low. It should adhere well to both dielectric material and copper. Typically, copper diffusion barriers contain refractory metal compounds since these metals exhibit the low resistivity, adhere well to copper and can maintain good barrier properties at higher temperatures. Titanium, tantalum and tungsten metals and their nitrides are commonly used. More recently, other refractory metal compounds consisting of nickel, molybdenum, and cobalt have been investigated.

One must also take into account the processes and methods of forming the diffusion barrier. For example, the barrier material must be an effective copper diffusion barrier at all post-copper deposition temperatures. It must also be able to deposited and/or annealed at temperatures below which copper lines will start to migrate, typically no greater than 400 degrees Celsius. In addition, if the method for depositing the barrier layer results in a film that is too thick, it will take up too much of the space in the line trench. This would decrease the amount of copper that could be deposited and would impact the resistance of the interconnect line. Furthermore, if the method used results in a layer with poor step coverage. unacceptable void areas will be formed, especially in high aspect ratio trench regions prevalent in modem copper devices.

As copper line technologies continue to rapidly evolve and keep pace with the continual movement to smaller, higher performing devices, there is a continuing need for improving diffusion barriers and finding better methods for depositing them. For this reason, those in the industry continue to focus much of their work with in this area.

SUMMARY

The present invention addresses the problems identified above by providing methods to create a highly effective copper diffusion barrier layer (typically implemented as a capping layer). It accomplishes this with an electroless plating process (typically depositing a cobalt layer), followed by a nitridation step. The process allows for addition of nitrogen into a cobalt film to form a dense diffusion barrier comprising cobalt nitride. The process allows for the formation of cobalt nitride at lower temperatures than conventional CVD methods.

The processes of this invention may be generally understood as follows. A substrate having a copper-dielectric surface is provided. A cobalt layer is electrolessly deposited on the substrate. A cobalt nitride layer is formed over the cobalt layer to form a more effective barrier layer than the cobalt layer by itself.

It is to be understood that both the forgoing general description and the following detailed description are exemplary and explanatory only and are not restrictive of the invention, as claimed.

DETAILED DESCRIPTION

Overview

In the following detailed description of the present invention, certain specific embodiments are set forth in order to provide a thorough understanding of the invention. However, as will be apparent to those skilled in the art, the present invention may be practiced using alternate elements or processes. In some instances well-known processes, procedures and components have not been described in detail so as not to unnecessarily obscure aspects of the present invention.

As used herein, "cobalt" refers to chemically pure cobalt as well as cobalt containing any of a number of additional materials. These additional materials may be impurities or purposely added components such tungsten, boron, phosphorus and molybdenum. The additional material may form an alloy with the cobalt. Or it may dope the cobalt. Or it may form a non-equilibrium mixture with the cobalt. Further, the cobalt (with or without such additional material) may exist in various morphologies such as amorphous or polycrystalline morphologies with amorphous being preferred.

Figure 1A:
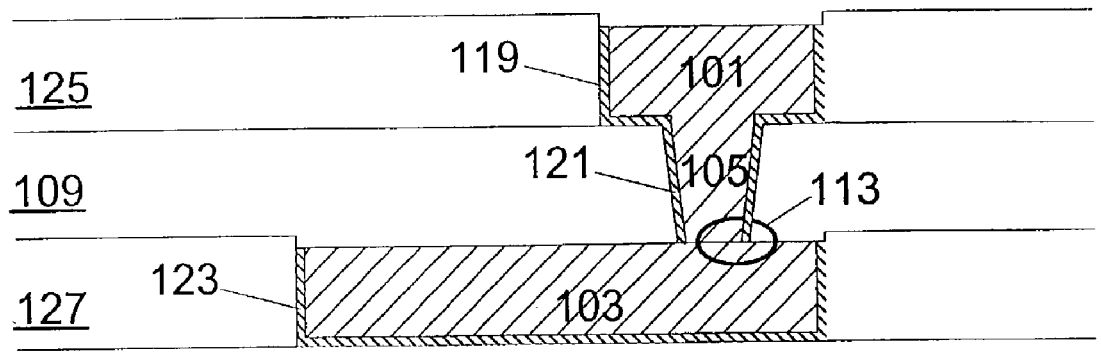
FIG. 1A is a schematic illustration of cross section of a portion of a simple dual damascene device showing copper electromigration and diffusion into inter-metal dielectric.
Figure 1B:
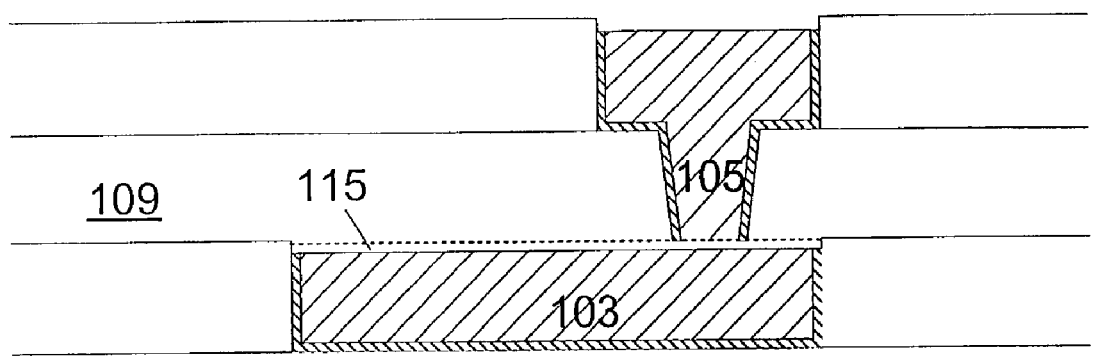
FIG. 1B is a schematic illustration of cross section of a portion of a simple dual damascene device with a capping layer selectively deposited over copper for blocking copper diffusion.
Figure 2:
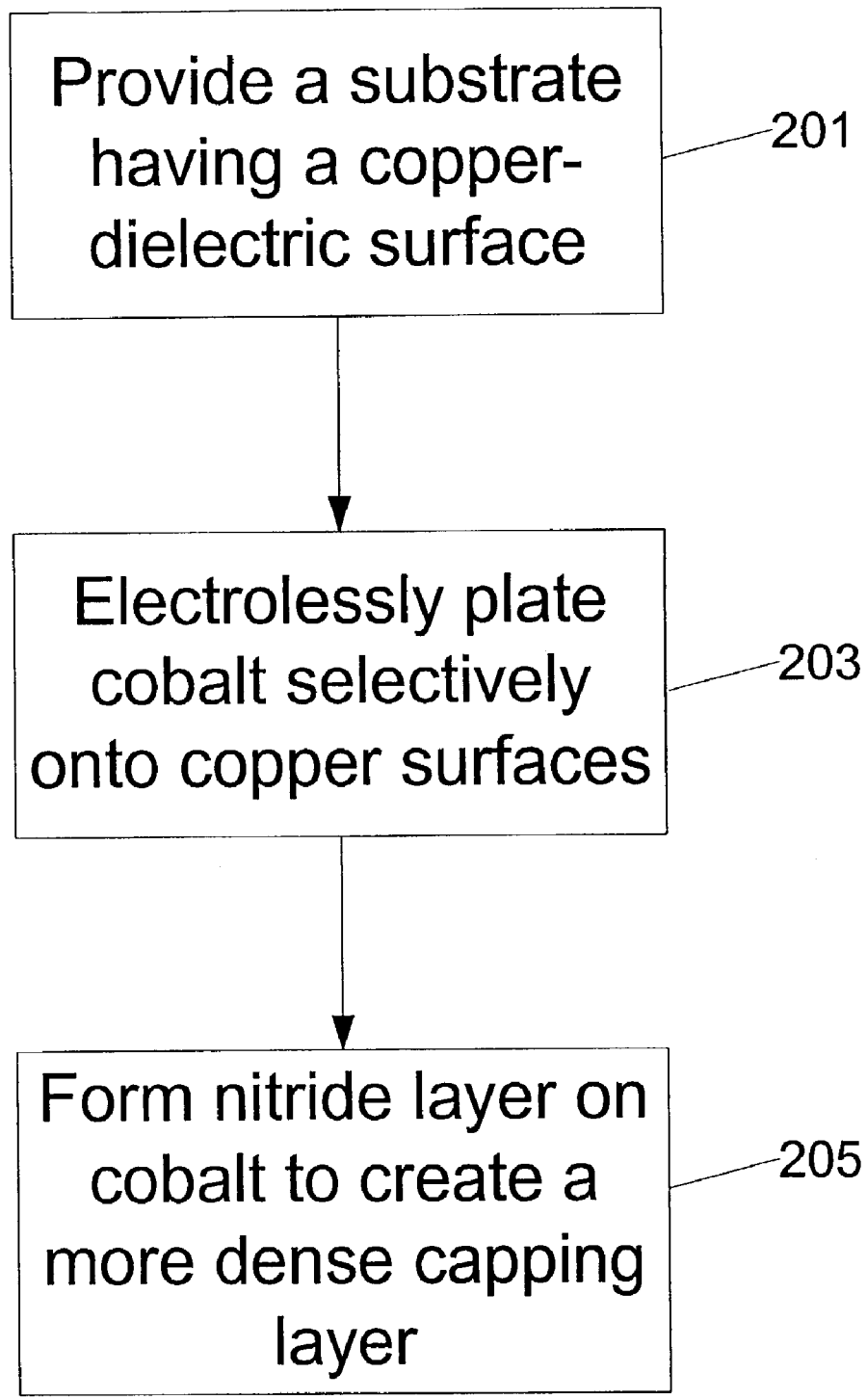
FIG. 2 s a process flow chart depicting the process steps for electroless deposition of cobalt on a copper-dielectric surface. followed by nitridation.

FIG. 2 is a flow diagram of a general three-operation process of this invention, presented in the context of operations in the fabrication of an integrated circuit. As depicted in process block 201, the process begins by providing a substrate having a copper-dielectric surface. In integrated circuit fabrication, the copper is provided in the form of conductive lines surrounded by supporting dielectric. In a typical damascene process, this surface in question is a wafer surface that has been planarized by chemical mechanical planarization (CMP) and subsequent cleaning. Next, as shown in process block 203, cobalt is deposited electrolessly on the copper-dielectric surface to produce a layer of cobalt. In some preferred embodiments, the cobalt is deposited with another material such as boron, tungsten, and/or phosphorus that promotes amorphous morphology in the deposited copper layer. Finally, as depicted in process block 205, the previously deposited cobalt layer is nitrided to form a thin cobalt nitride layer at the surface. Process blocks 203 and 205 will be described in detail.

Electroless Deposition of Cobalt

Traditionally, diffusion barrier materials have been deposited using physical vapor deposition (PVD) methods. However, these methods have relatively poor step coverage and have limitations when applied to surface features having high aspect ratios and very small feature sizes. Techniques such as chemical vapor deposition (CVD), atomic layer deposition (ALD) and variations of these are being developed to meet higher aspect ratio requirements. One technique, that is different than these gas phase methods and has gained popularity due to its excellent step coverage and lower cost is electroless deposition.

In electroless deposition, a thin metal film is formed on a substrate surface by reducing a complexed metal ion in an aqueous solution. Electroless deposition is so named because, unlike electrolytic deposition, the process does not require passage of an electric current. Because it allows a constant metal ion concentration to bathe all exposed surfaces of the substrate, the electroless technique deposits a thin layer of metal evenly along edges and inside holes and vias.

An electroless deposition bath includes at least a source of metal (typically ions) and a reducing agent. In a specific embodiment, the bath includes a metal salt (e.g., $CoSO_4$ or $CoCl_2$, for depositing cobalt), a reductant (e.g., ammonium hypophosphite or DMAB), a stabilizer (a catalytic poison to maintain the thermodynamically unstable bath), a complexing agent (prevents too much free metal) and a buffer (to keep pH range narrow). In some cases, the deposition surface is first "activated" with a "catalyst" prior to contact with the plating bath. Such catalyst usually contains a noble metal such as palladium, which acts as a nucleation surface to promote the deposition of further metal on the metal surfaces.

This invention involves the selective electroless deposition of cobalt over copper. Note that with minor changes and variations, however, this invention can be applied to the electroless deposition of other appropriate metals such as tantalum, titanium, tungsten, nickel and combinations and alloys thereof.

In a preferred embodiment, cobalt is electrolessly deposited to a thickness allowing the subsequent nitridation step (see FIG. 2, block 205) to create a capping barrier layer. The preferred cobalt thickness is about 50 angstroms to 500 angstroms, more preferably between about 100 angstroms to 300 angstroms. If necessary, a thin layer of palladium or other noble metal will comprise a small fraction of this thickness. To help initiate and enhance selective deposition, the substrate can be contacted with palladium chloride to activate the copper surface.

As indicated, the cobalt layer may be enhanced with small amounts of purposely added elements such as boron, phosphorus, and/or tungsten. Such films are sometimes represented herein as CoB, CoP, CoBP, CoWB, CoWP, etc. In a preferred embodiment, the concentration of boron and/or phosphorus in the cobalt layer ranges up to about 10% (atomic). More preferably, the concentration of boron in the layer ranges between about 0.5 and 5% (atomic). For phosphorus, the preferred concentration ranges between about 0.5 and 10% (atomic).

Electroless deposition of cobalt can form either of two microstructure morphologies of cobalt: polycrystalline and amorphous. The polycrystalline form comprises variously oriented crystalline structures with grain boundaries between them, while the amorphous form does not have these grain boundaries. For the purpose of creating an effective copper diffusion barrier (capping layer), an amorphous film is preferred over polycrystalline because polycrystalline grain boundaries are good pathways by which copper can diffuse. Further, amorphous films promote formation of an even uniform nitride layer over the cobalt layer. Note that a single film can contain regions that are polycrystalline and regions that are amorphous.

To promote a more amorphous cobalt film (and prevent localized crystalline formation), it is beneficial to add a few atomic percentage of dopant, such as boron, phosphorus or tungsten. In electroless deposition, this can be achieved by adding chemicals to the plating solution that act as dopant sources while the cobalt film is forming. In some cases, the dopant can come from a compound required by the plating solution, such as a reducing agent. For example, when dimethylamineborane (DMAB) is used as a reducing agent, the resultant plated cobalt film will contain some boron, thereby creating some CoB. Likewise, if ammonium hypophosphite is used as a reducing agent, the resultant cobalt film will contain some phosphorus, thereby creating some CoP.

Generally, increasing the concentrations of boron, phosphorus, tungsten, or other impurity (dopant) in the resulting cobalt layer increases the amorphous character of the layer. Relatively high impurity concentrations even seem to prevent the amorphous cobalt layers from transitioning to polycrystalline layers during subsequent high temperature (e.g., 350 C or greater) processing common in IC fabrication procedures. There is, however, an upper limit to the amount of dopant that can be deposited before the cobalt film begins to crack.

Regarding the electroless bath compositions various conventional reducing agents (e.g., aldehydes including glyoxylic acid) and cobalt sources (e.g. cobalt chloride ($COCl_2$) and cobalt sulfate ($CoSO_4$)) may be employed. In certain preferred embodiments of this invention, the reducing agent comprises at least one of DMAB (dimethylamine borane), ammonium hypophosphite ($NH_4H_2PO_4$) and hydrazine. As stated previously, using DMAB will result in some boron in the cobalt film, preferably between about 0.5% and 10% (atomic), and more preferably between about 0.5% and 5% (atomic), depending upon process conditions. The total concentration of boron in the cobalt layer is dictated by the molar ratio of boron containing precursor to cobalt source. In a preferred embodiment, the plating bath has a molar ratio of DMAB:$Co^{++}$of about 0.005:1 to 0.06:1. In a specific embodiment, the overall concentration of the reducing agent is preferably between about 0.01 M and 0.2 M, and more preferably between about 0.05 M and 0.1 M. In a further specific embodiment, $CoCl_2$ is employed at a concentration between about 0.03 M and 0.06 M. A citric acid monohydrate buffer may be employed in a concentration of between about 0.06 M and 0.12 M (M means mole/liter).

Using ammonium hypophosphite will result in some phosphorus in the cobalt film, preferably between about 0.5°O and 10% (atomic), and more preferably between about 0.5% and 5% (atomic), depending upon process condition. Again the concentration of phosphorus in the cobalt layer is dictated by the molar ratio of phosphorus to cobalt in the electroless plating bath. With ammonium hypophosphite reducing agent, it may be necessary to activate the substrate surface with palladium or other suitable noble metal. Contacting exposed copper lines with palladium chloride forms a thin layer of palladium directly on the copper. This then serves as a nucleation layer cobalt plating using hypophosphite. Note that plating from DMAB containing solutions does not require such activation.

One can also use both ammonium hypophosphite and DMAB together as reducing agents in the same electroless bath. This will result in boron (preferably between about 0.5% and 10% (atomic), and more preferably between about 1% and 5% (atomic)) and phosphorus (preferably between about 1% and 10% (atomic), and more preferably between about 0.5% and 5% (atomic)) in the cobalt film, depending upon process conditions. In such phosphorus-boron plating baths, the $CoCl_2$ concentration is preferably between about 0.03 M and 0.08 M. The DMAB concentration is preferably between about 0.03 M and 0.06 M. Further, the plating bath preferably employs citric acid monohydrate buffer in a concentration of between about 0.06 M and 0.16 M. It also preferably employs $NH_4Cl$ buffer (and supplementary complexing agent) in a concentration of no greater than about 0.48 M.

If a reducing agent does not contain a doping additive, such as is the case with hydrazine, another source of additive (e.g., a boron, phosphorus, or tungsten containing compound) can be added to the plating solution. In the case of tungsten additives, one example of a suitable plating bath additive is ammonium tungstate (($NH_4)_2WO_4$). The amount of tungsten within the cobalt film is preferably between about 0.5% and 10% (atomic), more preferably, between about 1% and 5% (atomic), depending upon process condition. In addition, using a combination of these reducing agents and dopant additives can create a variety of doped cobalt film such as CoBP, CoBW and CoPW.

Generally, though not necessarily, the plating bath solution is an aqueous solution. In addition to the metal source, the solvent, and the reducing agent itself, the solution may include one or more other components such a pH adjuster and one or more surfactants and/or stabilizers.

If used, surfactants can be added to either the reducing agent solution or the metal source solution, or even the deionized water or some other separately added component. Surfactants serve to modify grain structure, improve wetting, improve solution stability, and help displace evolved hydrogen gas. Examples of the suitable surfactants include PEG, PPG, triton X-100, RE610, and the like. In one specific embodiment, polyethylene glycol serves as a surfactant. The "Triton" surfactants available from Rohm and Haas of Philadephia, Pa. and RE610 available from Rhone Poulenc of Cedex France have been found work as suitable surfactants.

In one preferred embodiment, the concentration of polyethylene glycol in solution ranges up to about 1000 ppm, more preferably between about 100 and 500 ppm. Generally, the surfactant should be added in an amount sufficient to meet the desired goals (e.g. good wetting, solution stability, etc.).

Regarding the temperature of the electroless plating bath solution, it should be kept at a nominally low temperature. This is because the half-life of the bath solution is longer at lower temperatures and is, therefore, more cost effective. In addition, if the bath temperature is too high, evaporation and chemical decomposition (especially of the reducing agents) will occur. The preferred temperature range is not greater than about 100 degrees C. More preferably, the bath temperature ranges between about 45 degrees C. and 90 degrees C., and even more preferably between about 45 degrees C. and 85 degrees C.

Regarding pH buffers. as previously mentioned, citric acid monohydrate and or ammonium chloride are typically used. In addition, a tetramethyl amine hydroxide (TMAH) solution can also be used to control and stabilize pH values of the electroless plating solution. The pH of the electroless plating solution is nominally kept basic for optimal plating conditions. The preferred pH range is between about 7 and 10, more preferably between about 8.5 and 9.5.

Cobalt Nitridation

The next operation in the present invention involves the nitridation of the electrolessly plated cobalt film. Although it is conventionally understood that an ideal capping layer have a dense, amorphous microstructure, this is not always achieved using the electroless deposition processes alone. For example, it has been observed that one sample of electrolessly plated CoB was incapable of preventing copper diffusion during a thermal annealing process at 400 degrees Celsius for about 1 to 2 hours. This annealing process is a necessary in subsequent process steps in the manufacturing of damascene devices.

In accordance with this invention, the diffusion barrier properties of a cobalt film (doped or undoped) are improved by nitriding the cobalt film after the electroless deposition.

This can be achieved by exposure of the cobalt film to plasma containing nitrogen. Nitrides such as $CoN_X$ and $BN_X$ are well-known high temperature refractory materials with highly dense structures. Incorporation of these nitride materials as part of the diffusion barrier creates a more dense structure even when the layer is very thin, thereby enhancing the barrier properties. Note that conventional methods to form metallic nitrides involve high temperature (about 500 degree C.) CVD methods. The present invention allows for the formation of these metallic nitride films at much lower temperatures using electroless deposition followed by plasma nitridation.

In a preferred embodiment, the wafer is then taken out of the aqueous electroless plating solution, cleaned with deionized water, dried by spin drying or air drying and placed into a plasma chamber. The wafer is then exposed to an ambient plasma containing a nitrogen species (derived from, for example, an ammonia composition or a mixture of hydrogen and nitrogen).

Various suitable nitridation techniques are known to those of skill in the art. Many of these techniques involve contacting the substrate with a plasma containing nitride species. In one embodiment, the cobalt nitride layer is formed by placing the semiconductor substrate on a RF electrode and exposing the refractory metal surface to a nitrogen containing plasma. Suitable nitrogen containing gases comprises at least one of $N_2$, $NH_3$, and $N_2H_4$. Other gases that may be used include hydrogen and carrier gases (e.g., helium or argon). Nitrogen atoms and ions are generated in the plasma and react with the cobalt metal surface to form the nitride. The bias placed on substrate electrode affects the directional momentum of the ionic species striking the substrate. In a typical case, the bias of the RF electrode ranges between about 0.1 kilowatts and 5 kilowatts, more preferably between about 0.5 kilowatts and 1 kilowatt.

Other embodiments of the invention employ reactors having an RF electrode located away from the substrate. Such reactors may, in addition, include an electrode located beneath the substrate. In one example, the reactor includes an external RF electrode that is capacitively or inductively coupled. In some embodiments, a High Density Plasma (HPD) system can be used. Generally, a high-density plasma is any plasma having electron density of at least about $5 \times 10^9$ electrons per cubic centimeter. Typically, though not necessarily, high-density plasma reactors operate at relatively low pressures, in the range of 100 mTorr or lower. In a typical example, the electrode frequency used in such HPD systems is about 2.45 GHz, although other frequencies can be used. In some embodiments, the reactor employs a down-stream plasma.

In a specific example, the partial pressure of hydrogen ranges between about 0.1 and 1 mTorr and the partial pressure of nitrogen ranges between about 0.01 and 3 mTorr. More preferably, the hydrogen pressure is about 0.1 mTorr and the nitrogen pressure is about 0.1 mTorr. Typical exposure time to the plasma mixture is about 60 seconds. The chamber temperature is preferably between about 20 degrees C. and 500 degrees C., more preferably between about 20 degrees C. and 150 degrees C. Preferably, the chamber pressure is between about 1 mTorr and 10 Torr.

During exposure to the hydrogen and nitrogen plasma, the cobalt surface of the wafer becomes nitrided, resulting in the formation of a thin amorphous $CoN_X$ layer on top of the cobalt surface. If the cobalt layer includes polycrystalline regions, the nitridation operation preferentially forms nitride at the grain boundaries, thereby blocking the most likely diffusion paths. In addition to the cobalt nitride species, the amorphous nitrided cobalt layer may also contain $BN_X$ and/or $PN_X$ and/or $WN_X$, depending on the reducing agents/dopants used in the previous electroless deposition step. The resultant nitrided cobalt layer is preferably between about 20 angstroms to 400 angstroms thick, more preferably between about 20 angstroms to 200 angstroms thick (even more preferably between about 50 and 100 angstroms), depending on the nitridation and cobalt plating process conditions. The resultant cobalt film will contain preferably between about 0.1% and 20% (atomic), and more preferably between about 0.1% and 5% (atomic) of nitrogen, depending upon process conditions.

Figure 3:
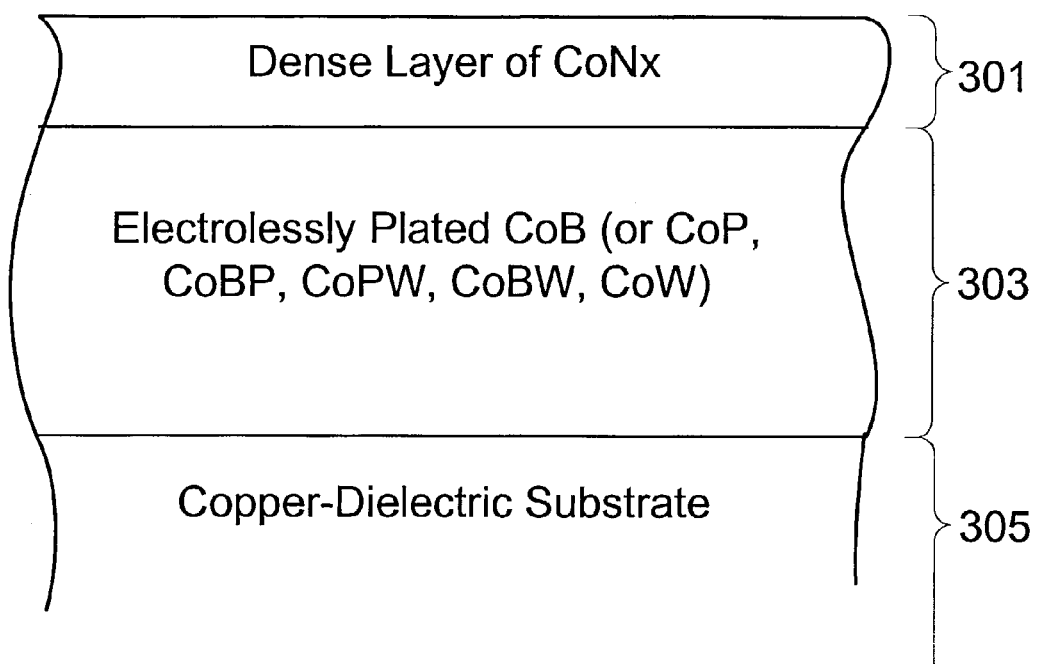
FIG. 3 is a schematic illustration of the resultant film stack after nitridation of electrolessly deposited cobalt over a copper-dielectric substrate.

FIG. 3 depicts the resultant barrier layer stack from the processes described in this invention: a dense layer of $CoN_X$ 301 (e.g., a capping layer), over electrolessly plated cobalt (with optional dopants) 303, over the substrate 305 (e.g., a partially fabricated semiconductor substrate having exposed copper lines). As indicated above, cobalt layer 303 preferably ranges between about 50 and 500 angstroms thick and nitride layer 301 preferably ranges between about 20 and 400 angstroms thick. Note that in some embodiments, the cobalt layer 303 is completely converted to nitride layer 301. In such cases, there is no separate cobalt layer 303 and nitride layer 301 resides directly on top of substrate 305. In preferred embodiments, nitride layer 301 (or nitride layer 301 together with cobalt layer 303) serves as a capping layer on top of copper lines in a semiconductor device. In some embodiments, the nitride layer (or nitride/cobalt bilayer) serves as a liner or conventional diffusion barrier on the edges of the vias and trenches provided in a dielectric support as part of a damascene fabrication procedure.

The invention has now been described in terms of certain specific embodiments. Those of skill in the art will understand that the compositions, materials, and process conditions described herein can be varied to achieve the desired capping layer, without departing from the spirit of the invention. Therefore, the following claims are not limited to the specific embodiments described above.

What is claimed is:

1. A method of forming a capping layer on copper lines of a semiconductor device, the method comprising:
   (a) electrolessly depositing a cobalt layer on an exposed surface of the semiconductor device such that the cobalt layer deposits on at least the copper lines of the exposed surface; and
   (b) exposing the cobalt layer deposited in (a) to a nitrogen containing plasma using temperatures no greater than about 500 degrees Celsius, thereby nitriding at least an upper portion of the cobalt layer deposited in (a) to form a cobalt nitride capping layer effective for reducing at least one of diffusion of copper and electromigration of copper from the copper line.

2. The method in clam 1, wherein the capping layer is selectively deposited on the surfaces of copper lines, without depositing significantly on surrounding dielectric surfaces.

3. The method in claim 1, wherein the cobalt layer comprises at least one of boron and phosphorus and tungsten.

4. The method in claim 1, wherein the cobalt nitride capping layer ranges between about 20 and 400 angstroms in thickness.

5. The method in claim 1, wherein the nitriding converts the entire cobalt layer to the cobalt nitride capping layer.

6. The method of claim 1, wherein electrolessly depositing a cobalt layer comprises contacting the exposed surface with a plating bath comprising a reducing agent selected from the group consisting of dimethylamine borane (DMAB), hydrazine, and ammonium hypophosphite.

7. The method of claim 6, wherein the plating bath contains boron and cobalt in a molar ratio of between about 0.005:1 to 0.06:1.

8. The method of claim 6, wherein the plating bath comprises ammonium hypophosphite.

9. The method of claim 6, wherein the plating bath comprises DMAB.

10. The method of claim 1, wherein electrolessly depositing a cobalt layer comprises contacting the exposed surface with a plating bath comprising at least one compound including at least one of boron, phosphorus, and tungsten, wherein the cobalt layer comprises at least one of boron, phosphorus, and tungsten.

\* \* \* \* \*